(12) United States Patent
Shim (10) Patent No.: US 8,941,243 B2
(45) Date of Patent: Jan. 27, 2015

(54) SEMICONDUCTOR DEVICE AND METHOD OF MANUFACTURING THEREOF

(71) Applicant: Samsung Electronics Co., Ltd., Gyeonggi-do (KR)

(72) Inventor: Woo-seok Shim, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 29 days.

(21) Appl. No.: 13/768,125

(22) Filed: Feb. 15, 2013

(65) Prior Publication Data

US 2013/0328210 A1    Dec. 12, 2013

(30) Foreign Application Priority Data

Jun. 8, 2012   (KR) .................. 10-2012-0061674

(51) Int. Cl.
| | | |
|---|---|---|
| H01L 23/48 | (2006.01) | |
| H01L 23/498 | (2006.01) | |
| H01L 21/768 | (2006.01) | |
| H01L 23/528 | (2006.01) | |
| H01L 23/00 | (2006.01) | |

(52) U.S. Cl.
CPC .... *H01L 23/49827* (2013.01); *H01L 21/76885* (2013.01); *H01L 23/49822* (2013.01); *H01L 23/5286* (2013.01); *H01L 21/76838* (2013.01); *H01L 24/05* (2013.01); *H01L 2224/05073* (2013.01); *H01L 2224/05624* (2013.01); *H01L 2224/05666* (2013.01); *H01L 2224/05681* (2013.01)

USPC .......... 257/774; 257/700; 257/738; 257/758; 257/781; 257/784

(58) Field of Classification Search
CPC ....... H01L 21/70; H01L 21/746; H01L 21/77; H01L 21/82; H01L 23/50

See application file for complete search history.

(56) References Cited

U.S. PATENT DOCUMENTS

| | | | |
|---|---|---|---|
| 6,187,661 | B1 | 2/2001 | Lou |
| 6,664,641 | B2 | 12/2003 | Ohsaki et al. |
| 6,774,484 | B2 | 8/2004 | Mimino et al. |
| 7,928,580 | B2 | 4/2011 | Saito |
| 2002/0005584 | A1* | 1/2002 | Domae ........................ 257/758 |
| 2010/0237508 | A1 | 9/2010 | Utsumi |

FOREIGN PATENT DOCUMENTS

| | | |
|---|---|---|
| JP | 2009-200256 | 9/2009 |
| JP | 2010-186941 | 8/2010 |
| KR | 1020030052274 | 6/2003 |
| KR | 1020080097032 | 11/2008 |
| KR | 1020100052299 | 5/2010 |

\* cited by examiner

*Primary Examiner* — Kyoung Lee
(74) *Attorney, Agent, or Firm* — F. Chau & Associates, LLC (57) ABSTRACT

A semiconductor device includes a substrate, a plurality of signal lines, and at least one power line. The substrate includes an integrated circuit unit. The signal lines are disposed on the substrate and are configured to provide the integrated circuit unit with signals. The power line is disposed on the substrate and is configured to provide the integrated circuit unit with power supply on the substrate. The power line includes a stacked structure including a first power line and a second power line stacked on the first power line.

18 Claims, 10 Drawing Sheets

FIG. 7 though exemplary embodiments are described as single embodiments, the scope of this application should not be limited as such.

SEMICONDUCTOR DEVICE AND METHOD OF MANUFACTURING THEREOF

CROSS-REFERENCE TO RELATED APPLICATION

This application claims priority under 35 U.S.C 119 to Korean Patent Application No. 10-2012-0061674, filed on Jun. 8, 2012, in the Korean Intellectual Property Office, the disclosure of which is incorporated by reference herein in its entirety.

TECHNICAL FIELD

The inventive concept relates to a semiconductor device, and more particularly, to a semiconductor device including power lines and a method of manufacturing the same.

DISCUSSION OF RELATED ART

The increasing density of semiconductor devices decreases a line width of a current carrying wire such as a power line and a signal line. As a result, current capacity through a power line reduces because a cross-section area through which current flows decreases. Such reduction of current may deteriorate an operation stability of the semiconductor device.

SUMMARY

The inventive concept provides a semiconductor device including power lines having a stacked structure and a method of manufacturing the same.

According to an exemplary embodiment of the inventive concept, a semiconductor device includes a substrate, a plurality of signal lines, and at least one power line. The substrate includes an integrated circuit unit. The signal lines are disposed on the substrate and are configured to provide the integrated circuit unit with signals. The power line is disposed on the substrate and is configured to provide the integrated circuit unit with power supply on the substrate. The power line includes a stacked structure including a first power line and a second power line stacked on the first power line.

According to an exemplary embodiment of the inventive concept, a semiconductor device includes signal lines disposed on a substrate. A first power line is disposed on the substrate and extends in a first direction. The top surface of the first power line is substantially at the same level as top surfaces of the plurality of signal lines. A second power line is disposed on the first power line and extends in the direction. A bottom pad is disposed on the substrate. The top surface of the bottom pad is substantially level with the top surfaces of the plurality of signal lines.

According to an exemplary embodiment of the inventive concept, a method of manufacturing a semiconductor device includes forming a substrate. The substrate includes an integrated circuit unit. A signal line and a first power line are formed on the substrate. A width of the signal line is less than that of the first power line. A top surface of the signal line is substantially level with that of the first power line. An insulating interlayer is formed on the signal line and the first power line. A second power line is formed on the first power line. The second power line penetrates the insulating interlayer and a top surface of the second power line is substantially level with that of the insulating interlayer.

BRIEF DESCRIPTION OF THE DRAWINGS

These and other features of the inventive concept will become more apparent by describing in detail exemplary embodiments thereof with reference to the accompanying drawings of which.

DETAILED DESCRIPTION OF THE EMBODIMENTS

Exemplary embodiments of the inventive concept will be described below in more detail with reference to the accompanying drawings. However, the inventive concept may be embodied in different forms and should not be construed as limited to the embodiments set forth herein. Rather, these exemplary embodiments are provided so that this disclosure will be thorough and complete and will fully convey the inventive concept to those skilled in the art. In the drawings, the thickness of layers and regions may be exaggerated for clarity. Like reference numerals may refer to the like elements throughout the specification and drawings.

Figure 1:
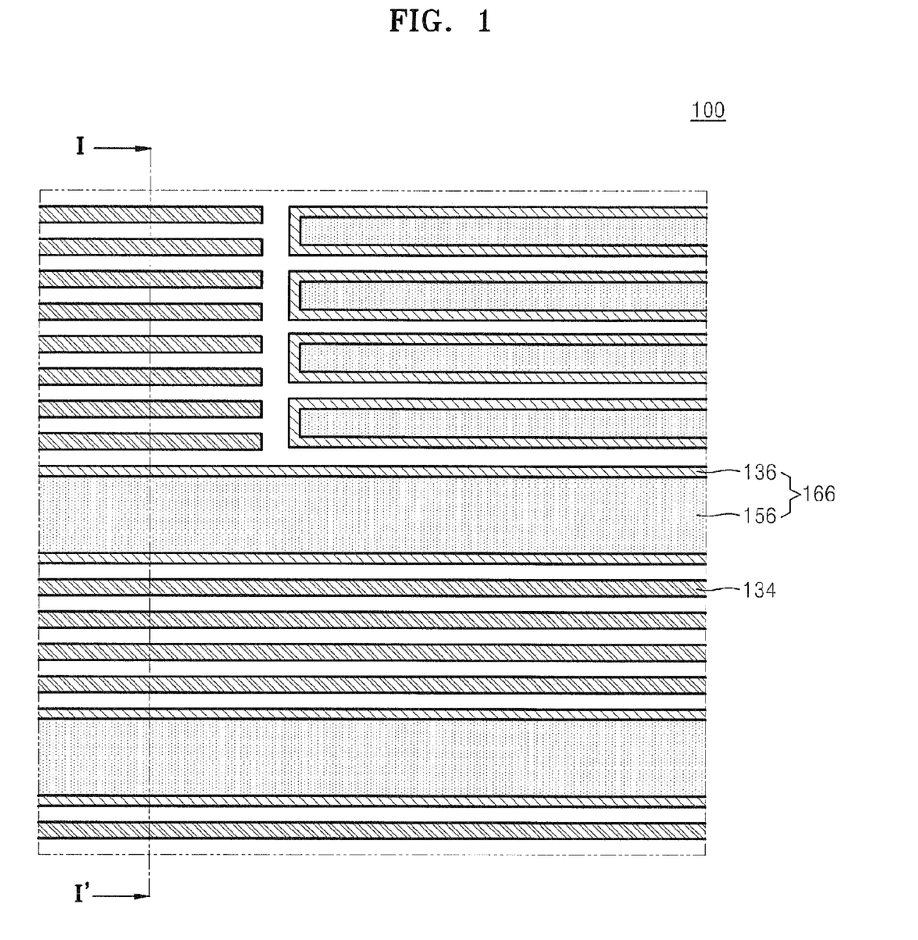
FIG. 1 illustrates a layout of a semiconductor device according to an exemplary embodiment of the inventive concept.
Figure 2:
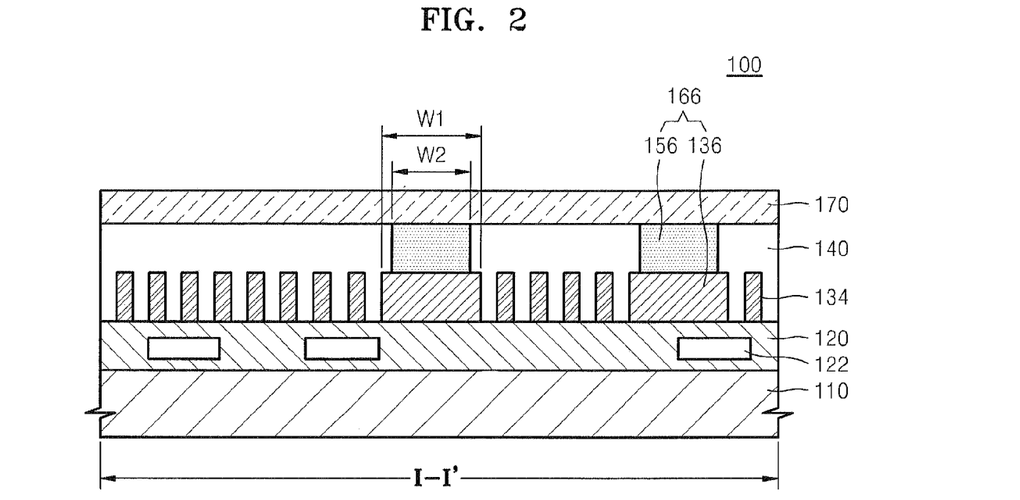
FIG. 2 is a cross-sectional view of the semiconductor device taken along line I-I' of FIG. 1.

FIG. 1 illustrates a layout of a semiconductor device 100 according to an exemplary embodiment of the inventive concept. FIG. 2 is a cross-sectional view of the semiconductor device 100 taken along line I-I' of FIG. 1.

Referring to FIGS. 1 and 2, an integrated circuit unit 122 may be formed on a substrate 110, and a first insulating interlayer 120 that covers the integrated circuit unit 122 may be formed on the substrate 110. The integrated circuit unit 122 may be a functional unit of a semiconductor device including a DRAM memory device, a flash memory device, a logic device, and/or an analog device according to a type of the semiconductor device 100. For example, such function unit includes a memory cell, sense amplifier, an address decoder, a voltage generator, a shift register, and/or a digital-to-analog converter. Also, a plurality of wire patterns (not shown) and a plurality of insulation layers (not shown) may be formed inside the first insulating interlayer 120.

Signal lines 134 that are electrically connected to the integrated circuit unit 122 may be formed on the first insulating interlayer 120. The signal lines 134 may be configured to transmit input/output signals to the integrated circuit unit 122.

For example, the signal lines 134 may be electrically connected to the integrated circuit unit 122 through bit lines (not shown). The layout of FIG. 1 shows an exemplary arrangement of the signal lines 134. The signal lines 134 may be formed having various patterns according to the type and design of the semiconductor device 100. The signal lines 134 may be formed in linear shapes having predetermined widths. For example, line widths of the signal lines 134 may be range from about 20 nm to about 100 nm. However, the inventive concept is not limited thereto.

Power lines 166 that are electrically connected to the integrated circuit unit 122 may be formed on the first insulating interlayer 120. The power lines 166 may be configured to supply power to the integrated circuit unit 122. The power lines 166 may include at least one bottom power line 136 and one top power line 156 that are sequentially stacked on the first insulating interlayer 120.

The bottom power lines 136 may be formed in linear shapes having predetermined widths on the first insulating interlayer 120. For example, the bottom power lines 136 may have a first width W1 in a range of several hundreds of nanometers and several micrometers, and may have heights similar to those of the signal lines 134.

The top power line 156 may be formed on the bottom power lines 136 and may be in a linear shape having a predetermined length. The top power line 156 may have a second width W2 in a range of several hundreds of nanometers and several micrometers. The second width W2 may be substantially equal to or smaller than the first width W1. For example, when the bottom power lines 136 have the first width W1 and extend in a direction on the first insulating interlayer 120, the top power line 156 may have the second width W2 that is smaller than the first width W1 and extends in the direction that the bottom power lines 136 extend. Thus, the whole bottom surface of the top power line 156 may contact the bottom power lines 136.

In an exemplary embodiment, top surfaces of the bottom power lines 136 may be disposed on the same plane as top surfaces of the signal lines 134, and a top surface of the top power line 156 may be higher than the top surfaces of the signal lines 134. The lower the resistance of the top power line 156, the more the IR drop decreases, and thus power necessary for driving the semiconductor device 100 may be reduced. The power lines 166 may be formed having widths and heights greater than those of the signals lines 134 to prevent the resistance of the power lines 156 from increasing due to a reduction in cross-sections of the power lines 166.

A second insulating interlayer 140 that covers side walls of the signal lines 134 and the power lines 166 may be formed on the first insulating interlayer 120. A top surface of the second insulating interlayer 140 may be formed on the same plane as the top surface of the top power line 156. The second insulating interlayer 140 may completely cover the top surfaces of the signal lines 134.

A passivation layer 170 may be formed on the second insulating interlayer 140 and the power lines 166.

The semiconductor device 100 according to an inventive concept may include the power lines 166 each having a structure in which the top power line 156 are stacked on the bottom power line 136 and have heights greater than those of the signal lines 134. Thus, compared to a case where power lines are formed as metal lines including a single layer, the cross-sections of the power lines 166 increase, which may reduce the resistance of the power lines 166. Thus, a sufficient amount of current necessary by the semiconductor device 100 may be supplied, thereby improving operation reliability of the semiconductor device 100. Also, a planar area in which the power lines 166 are formed is reduced by stacking the power lines 166, and thus an area in which the signal lines 134 are formed need not be compromised due to the power lines 166 requiring enough area to supply power stably to the integrated circuit unit 122.

FIGS. 3A through 3D are cross-sectional views illustrating a method of manufacturing the semiconductor device 100, according to an exemplary embodiment of the present inventive concept. The same reference numerals in FIGS. 1 through 3D denote the same elements, and thus, redundant descriptions are omitted.

Figure 3A:
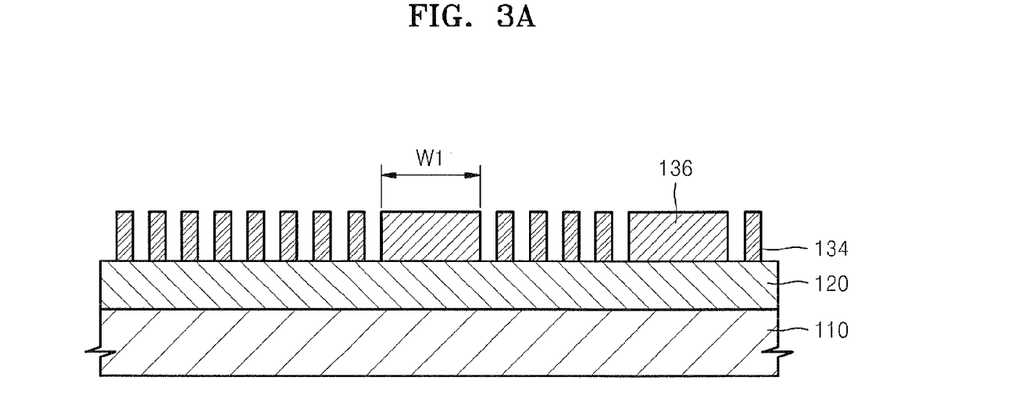
FIGS. 3A through 3D are cross-sectional views illustrating a method of manufacturing a semiconductor device, according to an exemplary embodiment of the present inventive concept.

Referring to FIG. 3A, the first insulating interlayer 120 in which an integrated circuit unit (not shown) is formed may be formed on the substrate 110.

Thereafter, a conductive layer (not shown) may be formed on the first insulating interlayer 120, and a photoresist pattern (not shown) may be formed on the conductive layer. The photoresist pattern is used to pattern the conductive layer, and thus the signal line 134 and the bottom power line 136 may be formed on the first insulating interlayer 120. The conductive layer may be formed of a metal such as aluminum, copper, tungsten, titanium, ruthenium, tantalum, or a combination of thereof. The signal line 134 and the bottom power line 136 may be electrically connected to the integrated circuit unit 122 and may be formed in linear shapes having predetermined widths. For example, the signal line 134 may include a plurality of lines having widths in a range of about 20 nm and about 100 nm, and the bottom power line 136 may include at least one line having a first width W1 in a range of several hundreds of nanometers and several micrometers.

Figure 3B:
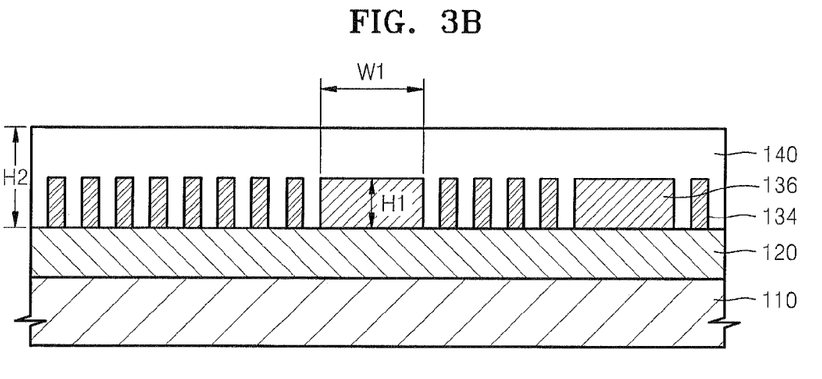

Referring to FIG. 3B, the second insulating interlayer 140 that covers the signal line 134 and the bottom power line 136 may be formed on the first insulating interlayer 120. The second insulating interlayer 140 may be formed to a predetermined height enough to cover the signal lines 134. For example, a height H2 of the second insulating interlayer 140 may be about 1.5 and about 10 times a height H1 of the bottom power line 136. In an exemplary embodiment, the second insulating interlayer 140 may include a silicon oxide, a silicon oxynitride, and/or a silicon nitride that are formed by a chemical vapor deposition (CVD) process and/or an atomic layer deposition (ALD) process.

Figure 3C:
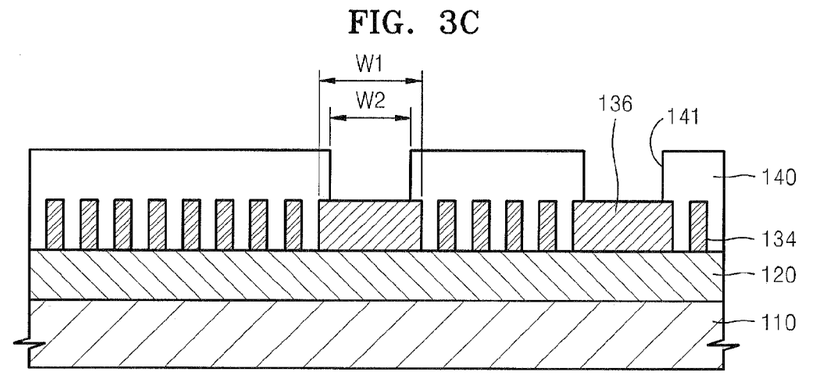

Referring to FIG. 3C, an opening 141 exposing a top surface of the bottom power line 136 may be formed in the second insulating interlayer 140. The opening 141 may be formed having a predetermined width and extend in the direction that the bottom power line 136 extends. For example, the opening 141 may be formed in a trench shape extending in one direction. The opening 141 may be formed having a second width W2 that is equal to or smaller than the first width W1 of the bottom power line 136.

In a photolithography process for forming the opening 141, a minimum line width of the opening 141 may be in a range of several hundreds of nanometers and several micrometers. The minimum line width in the photolithography process is quite large compared to a minimum line width for patterning in a process of patterning to form the signal line 134. Thus, high resolution photolithography equipment need not be used to form the opening 141.

Figure 3D:
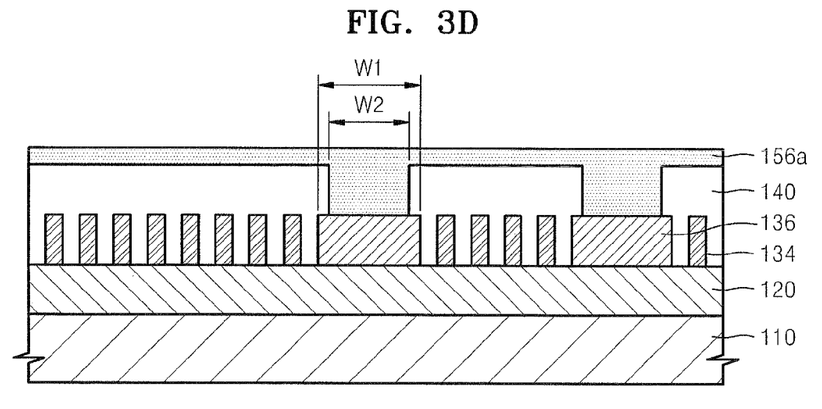

Referring to FIG. 3D, a conductive layer 156a that fills the opening 141 may be formed. In an exemplary embodiment, the conductive layer 156a may be formed of the same material as or a different material from the bottom power line 136. For example, the conductive layer 156a may be formed of a metal such as aluminum, copper, tungsten, titanium, ruthenium, tantalum, or a combination of thereof.

A barrier layer (not shown) may be further formed before the conductive layer 156a is formed according to a type of the conductive layer 156a. For example, in a case where the conductive layer 156a is formed of copper, the barrier layer is formed having a predetermined thickness on side walls of the opening 141 and the bottom power line 136, and the inside of the opening 141 may be filled by forming the conductive layer 156a on the barrier layer. The barrier layer may function to prevent a material included in the conductive layer 156a from diffusing into the first and second insulating interlayers 120 and 140.

Referring to FIG. 2, the conductive layer (156a of FIG. 3D) may be planarized until a top surface of the second insulating interlayer 140 is exposed, and thus the top power line 156 may be formed in the opening 141. Such a planarizing process may be performed by a chemical mechanical polishing (CMP) process, and/or an etch-back process.

A structure in which the bottom power line 136 and the top power line 156 are stacked may be referred to as the power line 166.

In an exemplary embodiment, the top power line 156 may be stacked on a top surface of the bottom power line 136 and extend in a linear shape. The second width W2 of the top power line 156 is slightly smaller than the first width W1 of the bottom power line 136 in FIG. 2. Alternatively, the second width W2 of the top power line 156 may be equal to the first width W1 of the bottom power line 136. In an exemplary embodiment, a height of the top power line 156 may be about 0.5 and about 9 times a height of the bottom power line 136. The higher the height of the top power line 156, the smaller the first width W1 of the bottom power line 136 while the cross-section of the power line 166 remains unchanged. Thus, an area in which the top power line 156 is formed may be reduced, and an area in which the signal lines 134 are formed may be obtained.

Thereafter, the passivation layer 170 is formed on the second insulating interlayer 140 and the top power line 156.

According to an embodiment of the inventive concept, the power line 166 includes a stacked structure in which the top power line 156 are stacked on the bottom power line 136 to the effect that the resistance of the power line 166 may decrease. This stacked structure of the power line 166 may provide more planar area for manufacturing signal lines, which may in turn increase a distance between signal lines and may reduce signal interference between those signal lines. Also, such increased distance between signal lines and the stacked structure of the power line 166 may eliminate necessity of using a high resolution photolithography apparatus, thereby reducing manufacturing costs.

FIGS. 4A through 4D are cross-sectional views illustrating a method of manufacturing a semiconductor device 200 (FIG. 4D), according to an exemplary embodiment of the present inventive concept.

Figure 4A:
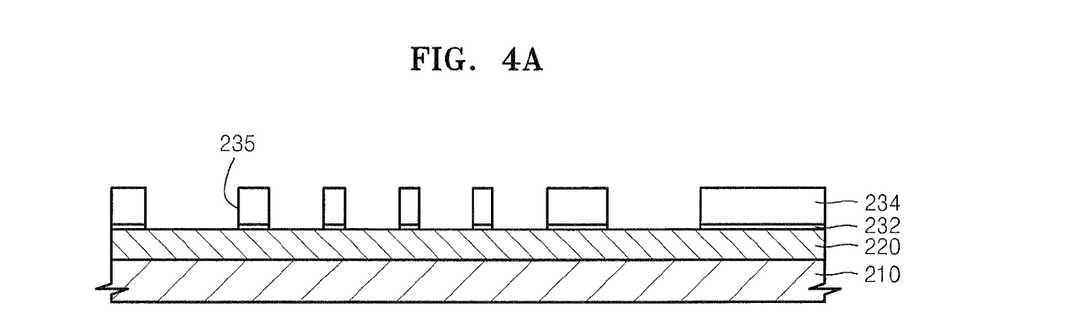
FIGS. 4A through 4D are cross-sectional views illustrating a method of manufacturing a semiconductor device, according to an exemplary embodiment of the present inventive concept.

Referring to FIG. 4A, an integrated circuit unit (not shown) may be formed on a substrate 210, and a first insulating interlayer 220 that covers the integrated circuit unit may be formed on the substrate 210.

A first etch stop layer 232 and a second insulating interlayer 234 may be sequentially formed on the first insulating interlayer 220. In an exemplary embodiment, the first etch stop layer 232 may be formed of a material having etch selectivity with respect to the second insulating interlayer 234. For example, the second insulating interlayer 234 may include a silicon oxide, and the first etch stop layer 232 may include a silicon nitride.

First openings 235 may be formed in the second insulating interlayer 234. For example, the second insulating interlayer 234 may be etched until a top portion of the first etch stop layer 232 is exposed through the first openings 235.

Thereafter, the first etch stop layer 232 exposed through the first openings 235 may be removed by selectively etching the first etch stop layer 232.

Figure 4B:
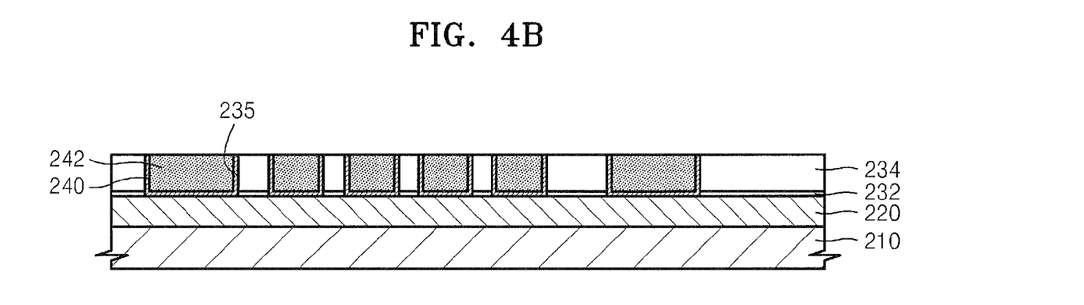

Referring to FIG. 4B, a first barrier layer 240 may be formed on the first insulating interlayer 220 exposed through the first openings 235. For example, the first barrier layer 240 may include aluminum, copper, tungsten, titanium, ruthenium, tantalum, or a combination of thereof. The first barrier layer 240 may function as a diffusion barrier layer that prevents metal materials in the first openings 235 from diffusing into the first and second insulating interlayers 220 and 234 during subsequent processes.

Thereafter, a conductive material (not shown) may be formed on the first barrier layer 240 formed on the side walls of the first openings 235 to form lower wire lines 242 in the first openings 235. Line widths and shapes of the lower wire lines 242 may vary with respect to the designs of connection pads 282 (FIG. 4D), power lines 286 (FIG. 4D), and signal lines 264 (FIG. 4D) that are to be formed on the lower wire lines 242. For example, line widths of the lower wire lines 242 on which the signal lines 264 are formed on top portions thereof may be smaller than line widths of the lower wire lines 242 on which the power lines 286 are formed on top portions thereof. The conductive material may use a metal such as aluminum, copper, tungsten, titanium, ruthenium, tantalum, or a combination of thereof.

Figure 4C:
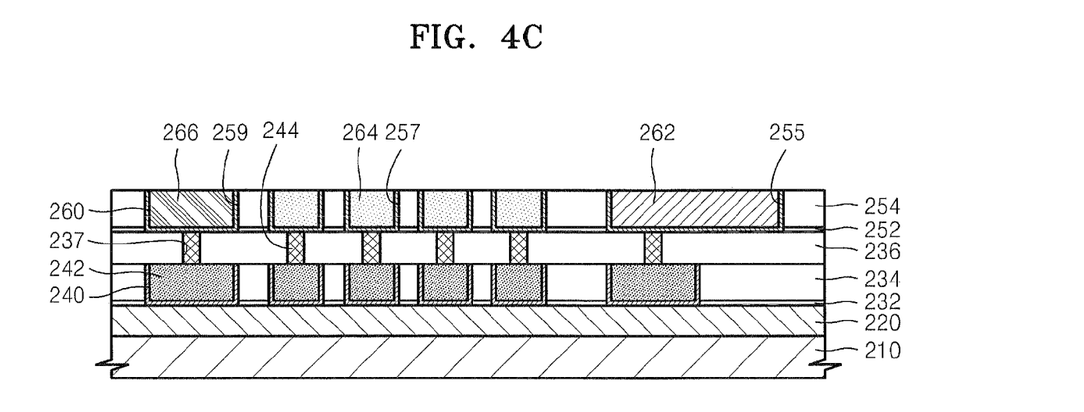

Referring to FIG. 4C, a third insulating interlayer 236 may be formed on the lower wire lines 242 and the second insulating interlayer 234. Second openings 237 may be formed in the third insulating interlayer 236 to expose top surfaces of the lower wire lines 242. In an exemplary embodiment, the second openings 237 may be formed in a cylindrical shape or polygonal column shape.

After a conductive layer (not shown) filling the second openings 237 is formed, a planarization process may be performed on a top portion of the conductive layer until a top surface of the third insulating interlayer 236 is exposed. Accordingly, bottom plugs 244 may be formed in the second openings 237.

A second etch stop layer 252 and a fourth insulating interlayer 254 may be sequentially formed on the bottom plugs 244 and the third insulating interlayer 236. Thereafter, the fourth insulating interlayer 254 and the second etch stop layer 252 may be sequentially etched to form third through fifth openings 255, 257, and 259 exposing top surfaces of the bottom plugs 244. A second barrier layer 260 may be formed on bottoms and side walls of the third through fifth openings 255, 257, and 259.

Thereafter, conductive materials filling the inside of the third through fifth openings 255, 257, and 259 may be formed on the fourth insulating interlayer 254 and may be planarized until a top surface of the fourth insulating interlayer 254 is exposed, and thus a bottom pad 262, the signal lines 264, a bottom power line 266 may be respectively formed in the third through fifth openings 255, 257, and 259.

Figure 4D:
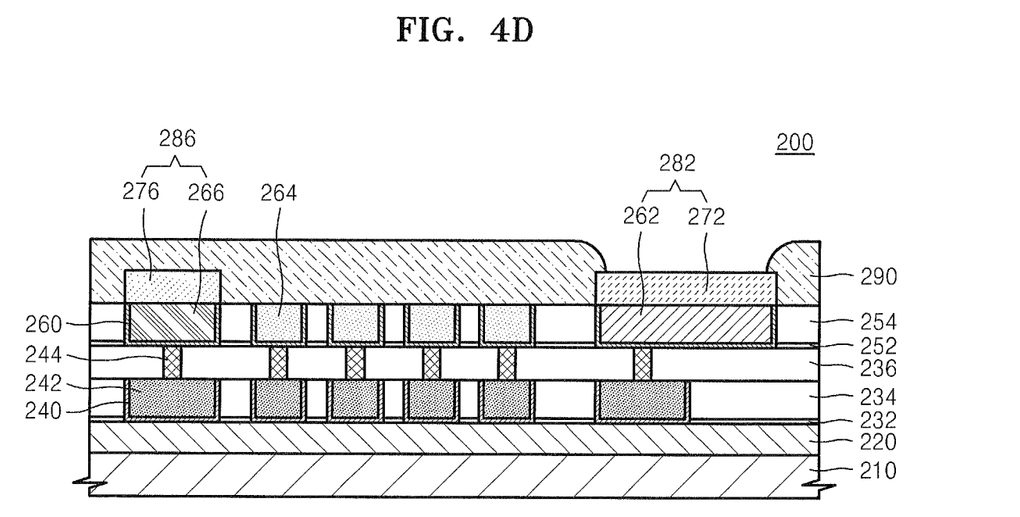

Referring to FIG. 4D, a conductive layer (not shown) may be formed on the bottom pad 262 and the bottom power line 266, and then patterned, and thus a top pad 272 and a top power line 276 may be respectively formed on the bottom pad 262 and the bottom power line 266. Accordingly, a stacked structure of the bottom power line 266 and the top power line 276 may function as a power line 286 of the semiconductor device 200, and the top pad 272 and the bottom pad 262 may function as a connection pad 282 for electrical connection of the semiconductor device 200. In a case where the bottom pad 262 includes a high ductile material, a bonding characteristic of the connection pad 282 may be deteriorated in a process of bonding a solder ball or a bonding wire onto the bottom pad 262. Accordingly, the top pad 272 including a low ductile material is formed on the bottom pad 262, and thus the bonding characteristic of the connection pad 282 may be increased. For example, in a case where the bottom pad 262 includes a material such as copper, the top pad 272 may be formed of aluminum, titanium, tantalum, or a combination of thereof.

Thereafter, a passivation layer 290 that covers the top power line 276, the signal lines 264, and an edge portion of the top pad 272 may be formed.

The method of manufacturing the semiconductor device 200 according to an embodiment of the inventive concept may simultaneously form the top pad 272 of the connection pad 282 and the top power line 276, thereby simplifying a manufacturing process of the power line 286.

Figure 5A:
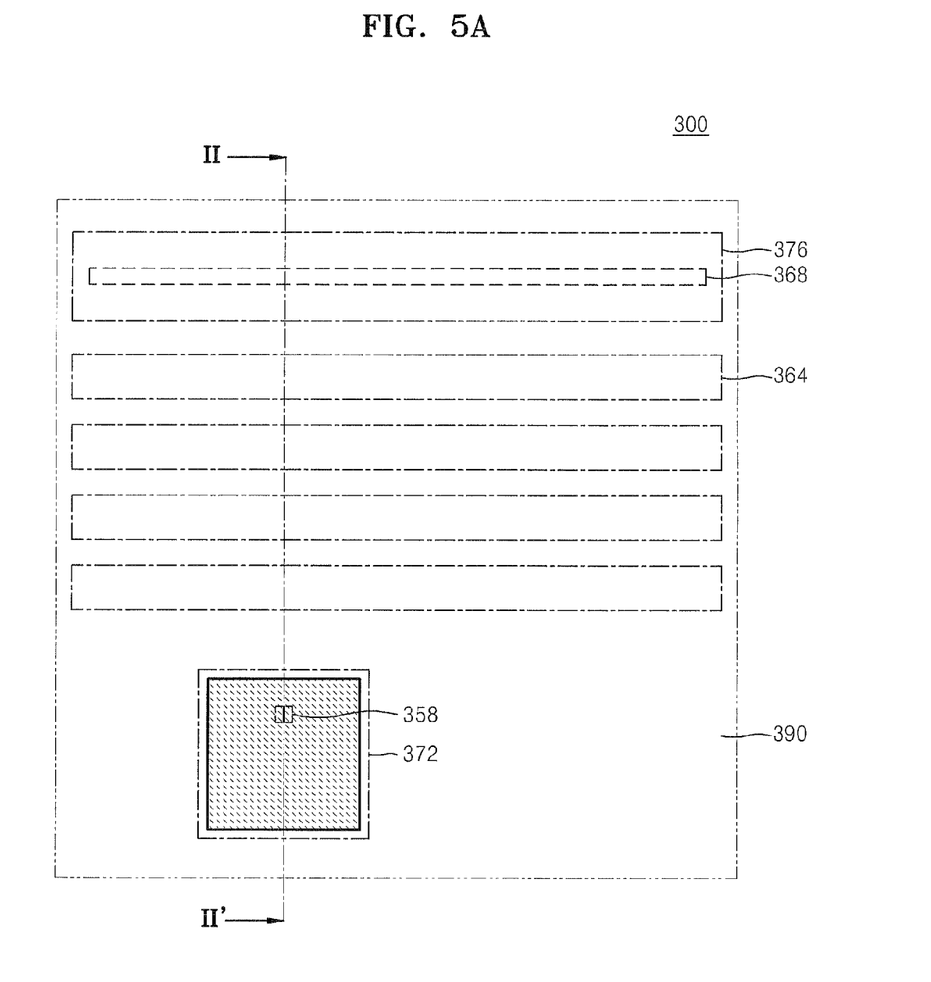
FIG. 5A is a plan view of a semiconductor device and FIGS. 5B and 5C are cross-sectional views illustrating a method of manufacturing the semiconductor device, according to an exemplary embodiment of the inventive concept.
Figure 5B:
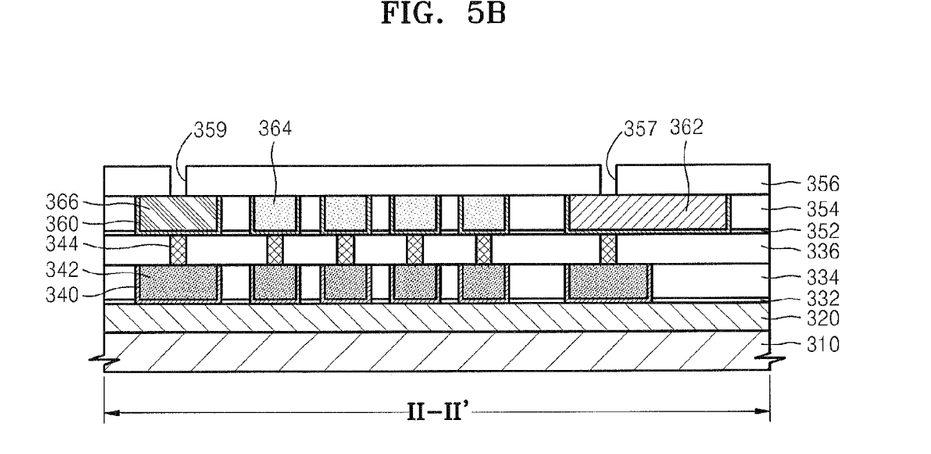
Figure 5C:
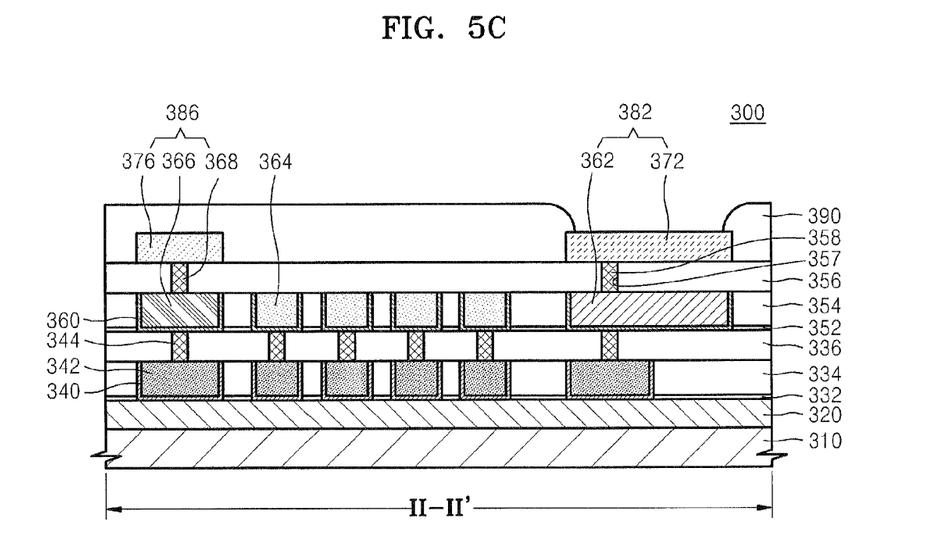

FIG. 5A is a plan view of a semiconductor device 300 and FIGS. 5B and 5C are cross-sectional views illustrating a method of manufacturing the semiconductor device 300, according to an exemplary embodiment of the inventive concept. The cross-sectional view of FIG. 5C is taken along line II-II' of FIG. 5A. The semiconductor device 300 is substantially similar to the semiconductor device 200 described with reference to FIGS. 4A through 4D, except that a power line 386 is formed as a stacked structure of first through third power lines 366, 368, and 376.

Referring to FIG. 5B, the processes described with reference to FIGS. 4A through 4C are performed to form the first through fourth insulating interlayers 320, 334, 336 and 354, a lower wire line 342, bottom plugs 344, a bottom pad 362, signal lines 364, and a first power line 366 (corresponding to the bottom power line 266 of FIG. 4C) on a substrate 310.

Thereafter, a fifth insulating interlayer 356 is formed on the bottom pad 362, the signal lines 364, the first power line 366, and the fourth insulating interlayer 354.

A sixth opening 357 and a seventh opening 359 respectively exposing the bottom pad 362 and the first power line 366 are formed in the fifth insulating interlayer 356. A single sixth opening 357 or a plurality of sixth openings 357 may be formed with respect to a single bottom pad 362 and may expose top surfaces of the bottom pad 362. The sixth opening 357 may be formed having a cross-section in a horizontal direction such as a circular shape, an oval shape, or a tetragonal shape. A seventh opening 359 exposing the first power line 366 may be formed in a trench shape in a direction to which the first power line 366 extends. In this regard, a width of the seventh opening 359 may be smaller than a width of the first power line 366. For example, the width of the seventh opening 359 may be similar to a width of the sixth opening 357.

Referring to FIG. 5C, a conductive layer (not shown) filling the sixth opening 357 and the seventh opening 359 may be formed on the fifth insulating interlayer 356, and a top portion of the conductive layer is planarized, and thus a pad plug 358 and the second power line 368 may be respectively formed in the sixth opening 357 and the seventh opening 359.

Thereafter, a conductive layer (not shown) may be formed on the fifth insulating interlayer 356, and then patterned to form a top pad 372 and the third power line 376 that are electrically connected to the pad plug 358 and the second power line 368, respectively. In an exemplary embodiment, the bottom pad 362 may include copper, and the top pad 372 may include aluminum.

A width of the second power line 368 may be smaller than a width of the first power line 366, and the whole bottom surface of the second power line 368 may contact the first power line 366. The third power line 376 may be formed on the second power line 368. A width of the third power line 376 may be greater than the width of the second power line 368. Accordingly, the whole top surface of the second power line 368 may contact the third power line 376. The first through third power lines 366, 368, and 376 may be referred to as the power line 386.

Thereafter, a passivation layer 390 that covers the third power line 376 and an edge portion of the top pad 372 may be formed on the fifth insulating interlayer 356.

According to an inventive concept, in the power line 386, the first power line 366 may be electrically connected to the third power line 376 through the second power line 368 in a linear shape. The contact area between the first through third power lines 366, 368, and 376 may increase, and the resistance of the power line 386 may be reduced.

Figure 6A:
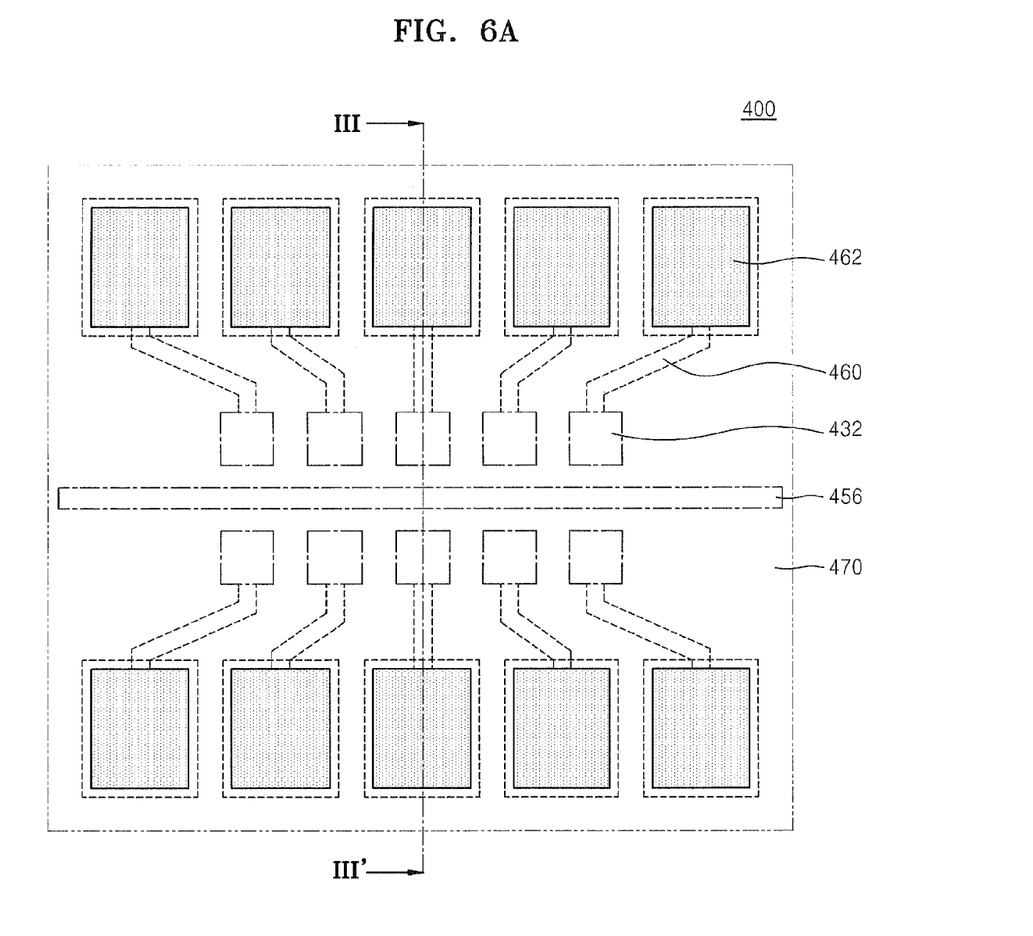
FIG. 6A is a plan view of a semiconductor device and FIGS. 6B through 6E are cross-sectional views illustrating a method of manufacturing the semiconductor device, according to an exemplary embodiment of the inventive concept.
Figure 6B:
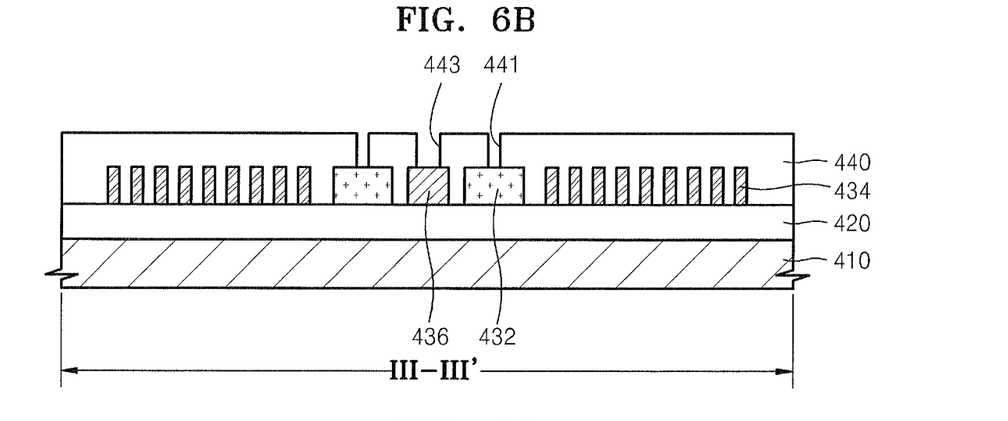
Figure 6C:
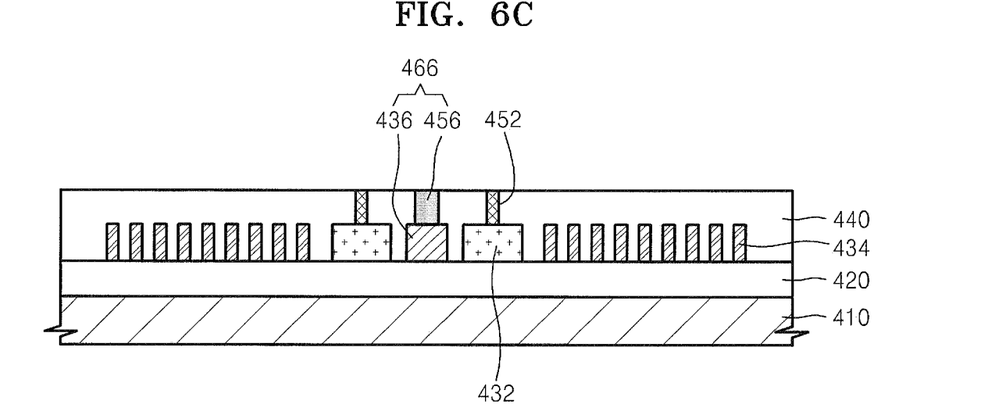
Figure 6D:
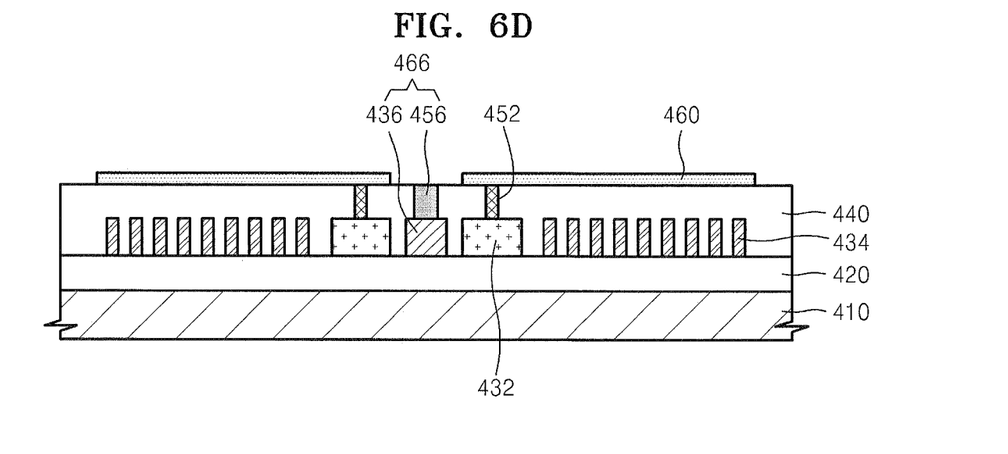
Figure 6E:
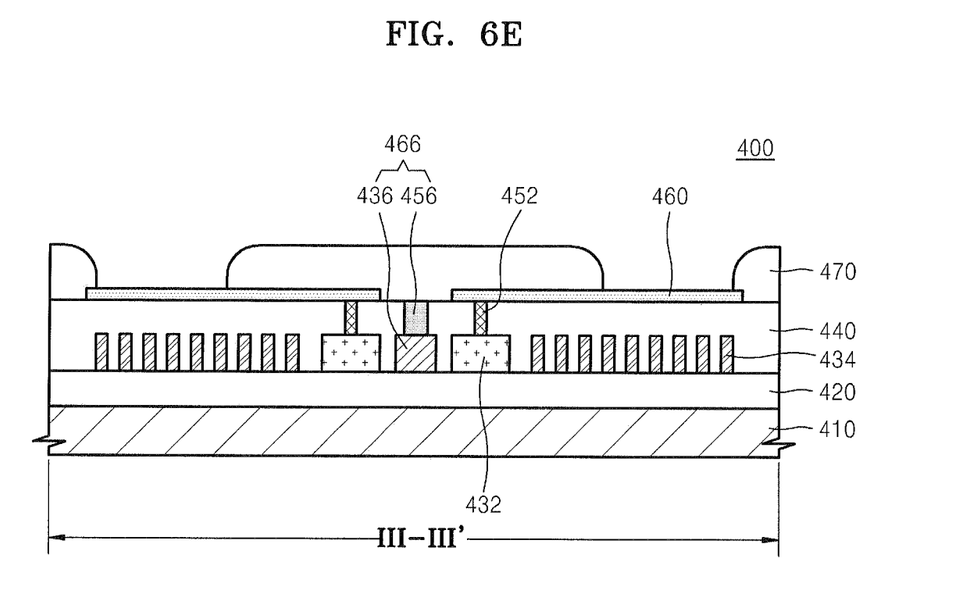

FIG. 6A is a plan view of a semiconductor device 400 and FIGS. 6B through 6E are cross-sectional views illustrating a method of manufacturing the semiconductor device 400, according to an exemplary embodiment of the inventive concept. The cross-sectional view of FIG. 6E through 6E is taken along line III-III' of FIG. 6A.

Referring to FIG. 6B, an integrated circuit unit (not shown) may be formed on a substrate 410, and a first insulating interlayer 420 that covers the integrated circuit unit may be formed on the substrate 410. A conductive layer (not shown) is formed on a first insulating interlayer 420 and is patterned, and thus a connection pad 432, signal lines 434, and a first power line 436 may be formed.

Thereafter, a second insulating interlayer 440 that covers the connection pad 432, the signal lines 434, and the first power line 436 may be formed on the first insulating interlayer 420. The second insulating interlayer 440 may include an insulation material such as a silicon nitride, polyimide, etc. For example, a height of the second insulating interlayer 440 may be about 1.5 and about 10 times the heights of the signal lines 434 but the inventive concept is not limited thereto.

Thereafter, a first opening 441 and a second opening 443 respectively exposing top surfaces of the connection pad 432 and the first power line 436 may be formed in the second insulating interlayer 440. The first opening 441 may be formed in a cylindrical shape or a polygonal column shape. The first opening 441 exposing the connection pad 432 may be singular or plural.

The second opening 443 may be formed in a trench shape in the direction to which the first power line 436 extends. In an exemplary embodiment, a width of the second opening 443 may be smaller than or equal to a width of the first power line 436.

Referring to FIG. 6C, a conductive layer (not shown) filling the first opening 441 and the second opening 443 may be formed on the second insulating interlayer 440. Thereafter, the conductive layer may be planarized until a top surface of the second insulating interlayer 440 is exposed. A via 452 may be electrically connected to the connection pad 432 and may be formed in the first opening 441. A second power line 456 may be electrically connected to the first power line 436 and may be formed in the second opening 443.

The second power line 456 and the first power line 436 may be referred to as a power line 466 of the semiconductor device 400. A top surface of the second power line 456 may be disposed on the same level as a top surface of the via 452. The second power line 456 may have a width that is the same as or smaller than a width of the first power line 436 and may extend in the direction to which the first power line 436 extends. The whole bottom surface of the second power line 456 may contact the first power line 436. A contact area between the first power line 436 and the second power line 456 increases, thereby preventing the resistance of the power line 466 from being reduced due to a reduction in the contact area.

Referring to FIG. 6D, a redistribution layer (not shown) may be formed on the second insulating interlayer 440, and the redistribution layer may be patterned to form a redistribution line 460 electrically connected to the via 452.

The redistribution line 460 may be used to, for example, allow the connection pad 432 formed in an edge portion of the semiconductor device 400 to be re-disposed with respect to a center portion of the semiconductor device 400 or allow the connection pad 432 formed in the center portion of the semiconductor device 400 to be re-disposed with respect to the edge portion of the semiconductor device 400. Also, the redistribution line 460 may be used to adjust spaces between or areas of the neighboring connection pads 432 formed in the semiconductor device 400. For example, when the spaces between the neighboring connection pads 432 are narrow, the redistribution line 460 connected to the connection pads 432 and redistribution pads (i.e., a portion of the redistribution line 460 that is not covered by a passivation layer 470) may be formed to increase spaces between or areas of the redistribution pads.

In an exemplary embodiment, the redistribution line 460 may be formed in a linear shape having various patterns with respect to a design of the semiconductor device 400. For example, the redistribution line 460 may be formed having a large width such that the part of the redistribution line 460 has a pad shape in a subsequent process.

Referring to FIG. 6E, a passivation layer 470 exposing a part of a top surface of the redistribution line 460 may be formed on the redistribution line 460, the second power line 456, and the second insulating interlayer 440. For example, the passivation layer 470 may be formed to cover the whole surfaces of the redistribution line 460 and the second insulating interlayer 440. The passivation layer 470 may include a photosensitive material, a silicon nitride, and/or a silicon oxide. With a photolithographic process, a portion of the passivation layer 470 may be removed to expose the redistribution line 460 and form the redistribution pads. As described above, the exposed portion of the redistribution line 460 may be defined as the redistribution pads.

According to the inventive concept, the power line 466 may be formed simultaneously with the formation of the via 452 used to form the redistribution line 460. That is, a height of the power line 466 is the same as a height of a top surface of the via 452, thereby increasing a height of the power line 466 in a vertical direction without performing an additional process. Therefore, the resistance of the power line 466 may be reduced and an area in which the signal lines 434 are formed may be sufficiently obtained.

Figure 7:
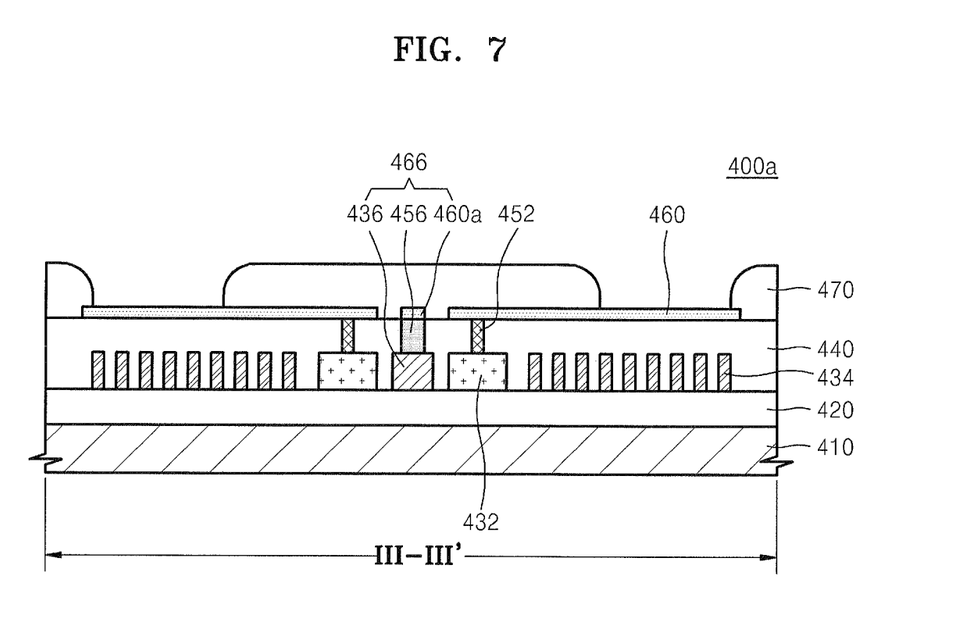
FIG. 7 is a cross-sectional view illustrating a method of manufacturing semiconductor device, according to an exemplary embodiment of the present inventive concept.

FIG. 7 is a cross-sectional view illustrating a method of manufacturing a semiconductor device 400a, according to an exemplary embodiment of the present inventive concept. The semiconductor device 400a is similar to the semiconductor device 400 described with reference to FIGS. 6A through 6E except that a third power line 460a is further formed.

Referring to FIG. 7, the processes described with reference to FIGS. 6A through 6C are performed. Thereafter, in a process of patterning a redistribution layer (not shown) to form the redistribution line 460, the third power line 460a may be formed by patterning a portion of the redistribution layer formed on a top portion of the second power line 456 in a linear shape having the same width as the second power line 456. The first through third power lines 436, 456, and 460a may function as the power line 466. The higher the height of the power line 466, the smaller the resistance of the power line 466, and an operational stability of the semiconductor device 400a may be increased.

While the present inventive concept has been shown and described with reference to exemplary embodiments thereof, it will be apparent to those of ordinary skill in the art that various changes in form and detail may be made therein without departing from the spirit and scope of the inventive concept.

What is claimed is:

1. A semiconductor device comprising:
   a substrate comprising an integrated circuit unit;
   a plurality of signal lines disposed on the substrate and configured to provide the integrated circuit unit with signals; and
   at least one power line disposed on the substrate and configured to provide power to the integrated circuit unit,
   wherein the at least one power line includes a stacked structure comprising a first power line and a second power line stacked on the first power line,
   and wherein a bottom surface of the second power line contacts a top surface of the first power line.

2. The semiconductor device of claim 1, wherein a height of the at least one power line is higher than heights of the plurality of signal lines.

3. The semiconductor device of claim 1, wherein a height of the first power line is substantially equal to heights of the plurality of signal lines.

4. The semiconductor device of claim 1, wherein a width of the second power line is less than or equal to a width of the first power line.

5. The semiconductor device of claim 1, further comprising an insulating interlayer disposed on the substrate and covering the plurality of signal lines and side walls of the first and second power lines.

6. The semiconductor device of claim 5, wherein a top surface of the second power is substantially level with a top surface of the insulating interlayer.

7. A semiconductor device comprising:
   a plurality of signal lines disposed on a substrate;
   a first power line disposed on the substrate and extending in a first direction, wherein a top surface of the first power line is substantially level with top surfaces of the plurality of signal lines; a second power line stacked on the first power line and extending in the direction; and
   a bottom pad disposed on the substrate, wherein a top surface of the bottom pad is substantially level with the top surfaces of the plurality of signal lines.

8. The semiconductor device of claim 7, further comprising a top pad stacked on the bottom pad, wherein a top surface of the top pad is substantially level with a top surface of the second power line.

9. The semiconductor device of claim 8, wherein the second power line includes a same material as that of the top pad.

10. The semiconductor device of claim 7, further comprising a third power line disposed between the first power line and the second power line, wherein the third power line includes a linear shape having a width less than widths of the first and second power lines.

11. The semiconductor device of claim 7, further comprising:
   an insulating interlayer covering the plurality of signal lines and side walls of the first and second power lines;
   a pad plug penetrating the insulating interlayer and electrically connected to the bottom pad; and
   a redistribution line formed on the insulating interlayer and electrically connected to the pad plug.

12. The semiconductor device of claim 11, wherein a top surface of the second power line is substantially level with a top surface of the pad plug.

13. The semiconductor device of claim 11, further comprising a third power line disposed on the second power line, wherein the top surface of the third power line is same level with a top surface of the redistribution line.

14. The semiconductor device of claim 11, wherein the third power line includes a substantially same material as that of the redistribution line.

15. A method of manufacturing a semiconductor device comprising:
   forming a signal line and a first power line on a substrate, wherein a width of the signal line is less than that of the first power line, and wherein a top surface of the signal line is substantially level with that of the first power line;
   forming an insulating interlayer on the signal line and the first power line; and
   forming a second power line on the first power line, wherein the second power line penetrates the insulating interlayer and a top surface of the second power line is substantially level with that of the insulating interlayer, wherein the first power line is in direct contact with the second power line.

16. The method of claim 15, further comprising forming a third power line disposed on the second power lines.

17. The method of claim 15, further comprising forming a bottom pad, wherein a top surface of the bottom pad is substantially level with that of the signal line.

18. The method of claim 17, further comprising:
   forming a third power line on the second power line; and
   forming a top pad on the bottom pad, wherein a top surface of the third power line is substantially with that of the top pad.

* * * * *